United States Patent [19]
Maas et al.

[11] Patent Number: 5,546,000
[45] Date of Patent: Aug. 13, 1996

[54] METHOD FOR THE REDUCTION OF RADIATION DAMPING DURING SIGNAL ACQUSITION IN NMR EXPERIMENTS

[75] Inventors: Werner E. Maas, Billerica; David G. Cory, Winchester; Frank H. Laukien, Lincoln, all of Mass.

[73] Assignee: Bruker Instruments, Inc., Billerica, Mass.

[21] Appl. No.: 409,641

[22] Filed: Mar. 24, 1995

[51] Int. Cl.⁶ .................................................. G01R 33/20
[52] U.S. Cl. ........................................ 324/322; 324/318
[58] Field of Search ................................. 324/300, 307, 324/309, 310, 311, 312, 313, 314, 315, 318, 322; 128/653.2, 653.3, 653.4

[56] References Cited

U.S. PATENT DOCUMENTS

| | | | |
|---|---|---|---|
| 4,646,017 | 2/1987 | Brown | 324/303 |
| 4,725,779 | 2/1988 | Hyde et al. | 324/318 |
| 4,769,605 | 9/1988 | Fox | 324/322 |
| 5,172,061 | 12/1992 | Crooks et al. | 324/322 |
| 5,285,161 | 2/1994 | Rzedzian et al. | 324/318 |

*Primary Examiner*—Michael Tokar
*Attorney, Agent, or Firm*—Bookstein & Kudirka, P.C.

[57] ABSTRACT

A method of reducing radiation damping during free induction decay in NMR measurements of samples having a narrow line width uses the active switching of the quality factor value of the coil circuit of an NMR detection probe. After application of an excitation pulse to the sample, data acquisition is accomplished in periodic samples. The Q of the coil circuit is set to a high value while each sample is being taken, but is reduced significantly in between samples by detuning the coil circuit. Minimization of the high-Q state of the coil circuit and maximization of the difference between the high Q value and the low Q value greatly decrease the detrimental effects of radiation damping on free induction decay. The coil circuit Q is modified automatically by the application of a Q switching signal generated by a controller, such as a computer which controls other aspect of the NMR experiment.

10 Claims, 3 Drawing Sheets

METHOD FOR THE REDUCTION OF RADIATION DAMPING DURING SIGNAL ACQUSITION IN NMR EXPERIMENTS

BACKGROUND OF THE INVENTION

1. Field of the Invention

This invention relates to nuclear magnetic resonance (NMR) spectroscopy and, in particular, to probes used in high resolution NMR experiments.

2. Description of the Related Art

All atomic nuclei of elements with an odd atomic mass or an odd atomic number possess a nuclear magnetic moment. Nuclear magnetic resonance is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split in to (2I+1) non-degenerate energy levels, which are separated from each other by an energy difference that is directly proportional to the strength of the applied magnetic field. This splitting is called the "Zeeman" splitting and the energy difference is equal to $hH_o/2\pi$, where h is Plank's constant and $H_o$ is the strength of the applied magnetic field. The frequency corresponding to the energy of the Zeeman splitting ($\omega_o=\gamma H_o$) is called the "Larmor frequency" and is proportional to the field strength of the magnetic field. Typical NMR active nuclei include $^1H$ (protons), $^{13}C$, $^{19}F$, $^{31}P$. For these four nuclei I=½, and each nucleus has two nuclear magnetic energy levels.

When a bulk sample of material containing NMR active nuclei is placed within a magnetic field called the main static field, the nuclear spins distribute themselves among the nuclear magnetic energy levels in accordance with Boltzmann's statistics. This results in a population imbalance among the energy levels and a net nuclear magnetization. It is this net nuclear magnetization that is studied by NMR techniques.

At equilibrium, the net nuclear magnetization of the aforementioned bulk sample is aligned parallel to the external magnetic field and is static (by convention, the direction of the main static field is taken to be the z-axis). A second magnetic field perpendicular to the main static magnetic field and rotating at, or near, the Larmor frequency can be applied to induce a coherent motion of the net nuclear magnetization. Since, at conventional main static magnetic field strengths, the Larmor frequency is in the megahertz frequency range, this second magnetic field is called a "radio frequency" or RF field.

The effect of the RF field is to shift the nuclear magnetization direction so that it is no longer parallel to the main static field. This shift introduces a net coherent motion of the nuclear magnetization about the main static field direction called a "nutation". In order to conveniently deal with this nutation, a reference frame is used which rotates about the laboratory reference frame z-axis at the Larmor frequency and also has its z-axis parallel to the main static field direction. In this "rotating frame" the net nuclear magnetization, which is rotating in the stationary "laboratory" reference frame, is now static.

Consequently, the effect of the RF field is to rotate the now static nuclear magnetization direction at an angle with respect to the main static field direction (z-axis). The new magnetization direction can be broken into a component which is parallel to the main field direction (z-axis direction) and a component which lies in the plane transverse to the main magnetization (x, y plane). The RF field is typically applied in pulses of varying length and amplitude and, by convention, an RF pulse of sufficient amplitude and length to rotate the nuclear magnetization in the rotating frame through an angle of 90°, or $\pi/2$ radians, and entirely into the x, y plane is called a "$\pi/2$ pulse".

Because the net nuclear magnetization is rotating with respect to the laboratory reference frame, the component of the nuclear magnetization that is transverse to the main magnetic field, or that lies in the x, y plane, rotates about the external magnetic field at the Larmor frequency. This rotation can be detected with a receiver coil that is resonant at the Larmor frequency. The receiver coil is generally located so that it senses voltage changes along one axis (for example, the x-axis) where the rotating magnetization component appears as an oscillating voltage. Frequently, the "transmitter coil" employed for applying the RF field to the sample and the "receiver coil" employed for detecting the magnetization are one and the same coil.

Although the main static field is applied to the overall material sample, the nuclear magnetic moment in each nucleus within the sample actually experiences an external magnetic field that is changed from the main static field value due to a screening from the surrounding electron cloud. This screening results in a slight shift in the Larmor frequency for that nucleus (called the "chemical shift" since the size and symmetry of the shielding effect is dependent on the chemical composition of the sample).

In a typical NMR experiment, the sample is placed in the main static field and a $\pi/2$ pulse is applied to shift the net magnetization into the transverse plane (called transverse magnetization). After application of the pulse, the transverse magnetization, or "coherence", begins to precess about the x-axis, or "evolve," due to the chemical shifts at a frequency which is proportional to the chemical shift field strength. In the rotating frame, the detector (which is stationary in the laboratory frame) appears to rotate at the Larmor frequency. Consequently, the detector senses an oscillation produced by an apparent magnetization rotation at a frequency which is proportional to the frequency difference between the Larmor frequency and the chemical shift frequency. Thus, the detected signal oscillates at the frequency shift difference.

In addition to precessing at the Larmor frequency, in the absence of the applied RF field energy, the nuclear magnetization also undergoes two spontaneous processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$; and (2) the individual nuclear spins return to their equilibrium population of the nuclear magnetic energy levels (so-called "spin-lattice relaxation") with an associated relaxation time, $T_1$. The latter process causes the received signal to decay to zero. The decaying, oscillating signal is called a free induction decay (FID).

This invention relates to a phenomenon observed in NMR experiments of samples with strong signals. The amount of signal that is detected with the receiver coil of an NMR probe is proportional to the amount of magnetization from the sample and to the quality factor Q of the probe circuit electronics. In the case of a sample with a high concentration of similar spins, such as in proton NMR of water in a probe with a high Q value, a strong NMR signal is detected. The large proton magnetization induces a large current in the receiver coil and this current, in turn, acts as an RF pulse, generating an oscillating magnetic field of the same frequency. This phenomenon is referred to as radiation damping. As a result of radiation damping, the magnetization, rotated by an RF pulse into the x, y plane, is rotated back to the positive z-axis by the radiation field that is induced by its own NMR signal. Radiation damping thus limits the time that the magnetization spends in the x, y plane and, consequently, limits the time available for signal detection. As a result, the resonance lines of spins affected by radiation damping are broadened which results in unwanted overlap of resonances and loss in spectral resolution.

Radiation damping decreases the observable free induction decay by reducing the amount of time which the magnetization spends in the transverse plane. This, in turn, leads to a broadening of the resonance line obtained after a Fourier transformation of the free induction decay. The rate of change of the magnetization vector due to radiation damping can be characterized by a time constant $T_d$, which depends on the amount of magnetization, the gyromagnetic constant y of the spins, and the quality factor Q of the probe. This rate of change is described by the equation:

$$T_d^{-1} = 2\pi Q n y M_o$$

where $M_o$ is the equilibrium magnetization and n is the filling factor of the coil A prior art approach to reduce radiation damping is to lower the Q of the probe circuit. This technique is described in detail in a publication entitled "Principles of Nuclear Magnetism", A. Abragam, International Series of Monographs on Physics, volume 32, Clarendon press, Oxford, 1989. By lowering the quality factor Q of the circuit, less voltage is induced in the receiver coil, resulting in a smaller current and a corresponding reduction in radiation damping. However, this method causes a loss in signal intensity since the induced voltage is proportional to the Q of the circuit. Furthermore, to obtain a 90° rotation of the magnetization, this method requires longer RF pulse lengths than are typically used with a high Q circuit.

The probes that are routinely used for NMR experiments have a high Q value to provide optimum sensitivity. The lowering of the Q value in these probes is achieved by manually detuning the probe electronics. The extent to which the Q is lowered is a compromise between a loss in signal strength and RF field strength and the suppression of radiation damping, a balance point that has been determined by trial and error. While this compromise helps reduce the detrimental effects of radiation damping, the accompanying loss in signal strength and RF field strength greatly decreases the sensitivity of the probe.

In another prior art method, the reduction of the quality factor of a probe circuit is used in a two-dimensional resonance experiment. In such experiments, an evolution time is used between the time of an excitation pulse and a subsequent mixing pulse, after which two dimensional data sampling is performed. Such a two-dimensional technique measures the correlation of spin dynamics in the two time intervals. For this type of experiment, it is known to reduce the Q of the probe circuit during the evolution time to reduce radiation damping which would otherwise increase the effect of large magnitude resonance signals (notably that of water) on the measured output. However, in this method, the Q reduction occurs only during the evolution time.

In still another prior art method, active Q switching is used to toggle between two nominally orthogonal RF coils during imaging of a solid sample. This method involves alternately switching low the Q of a circuit driving a quadrupolar NMR coil (which generates a gradient field) and a circuit driving a linear NMR coil (which generates a homogeneous field). The alternating Q switching results in the circuit for the quadrupolar coil having a high Q when the circuit for the linear coil has a low Q, and vice versa. This prior art method involves a combination of multiple pulse line narrowing and RF gradient spatial encoding both of which occur during data collection. The line narrowing is performed via the homogeneous coil with the homogeneous coil's Q high, and the encoding is performed via the gradient coil with the gradient coil's Q high. By toggling the high-Q state between the two coil circuits, the line narrowing, spatial encoding and data acquisition are intercolated into a periodic sequence. This method is unconcerned with the problems of radiation damping in sharp line resonance measurements.

It is therefore an object of the present invention to provide a means for reducing radiation damping during data acquisition in sharp line NMR experiments in a manner which is both reproducible and predictable, without being subjected to the magnitude of signal loss typical of prior art systems.

SUMMARY OF THE INVENTION

The present invention is a method for reducing the detrimental effects of radiation damping on NMR resonance signals by actively switching the Q value of an NMR probe coil circuit such that the circuit has a high Q value during the acquisition of each data sample, but has a low Q value in between data samples. A probe coil circuit has an RF coil tuned approximately to the Larmor frequency of a nuclei type of interest. A PIN diode arranged in parallel with the coil is switched on and off by application of a Q switching signal. A high frequency choke isolates the RF signal from the Q signal input, while allowing the Q signal to pass through it substantially unimpeded.

The Q signal is switched between a predetermined DC voltage ("high") and a relatively large negative voltage ("low"). The Q signal is applied to the PIN diode such that it is on (i.e. is conducting) when the Q signal is high, and is off (i.e. is not conducting) when the Q signal is low. In the preferred embodiment of the invention, the circuit components are such that a maximum Q value is achieved when the PIN diode is off, and a minimum Q value is achieved when the PIN diode is on.

The Q signal is preferably controlled by a controller, such as a data processor. Since the amount of reduction in the radiation damping increases with the relative amount of time that the probe coil circuit has the low Q value, the Q signal is brought low (and the circuit Q brought high) only for the times at which a data sample is obtained. The timing of the Q signal is precisely controlled such that the circuit remains in the high-Q state for only that amount of time necessary to take an accurate data sample. In general, maximizing the difference in Q between the low-Q state and the high-Q state, and minimizing the time during which the circuit is in the high-Q state maximizes the reduction in radiation damping.

DETAILED DESCRIPTION OF THE PREFERRED EMBODIMENTS

In a preferred embodiment of the present invention, the quality factor (Q) of a probe circuit for narrow line width NMR resonance spectra is switched electronically to alternate between a high Q value and a low Q value. To optimize the performance of the probe, the Q is switched low during time periods between the taking of data points ("low" cycles), and is switched high for time periods during which the data points are sampled ("high" cycles). The low Q value during the low cycles suppresses radiation damping, while a high Q value during the high cycles provides maximum sensitivity. The net effect of the method is to provide an overall reduction in the effects of radiation damping on the detected resonance signal, without sacrificing probe sensitivity.

Figure 1:
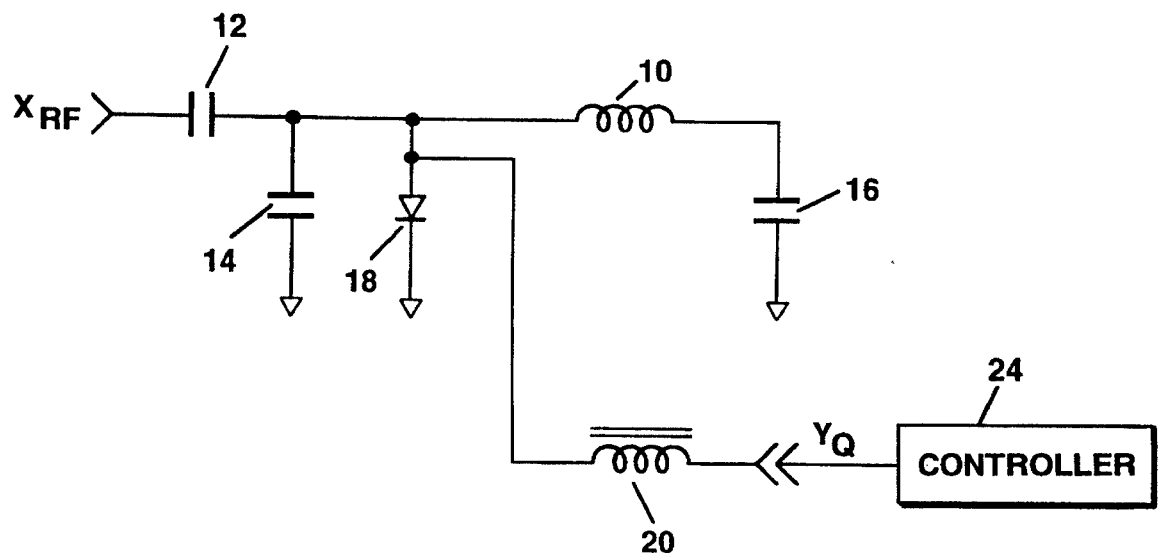
FIG. 1 is a schematic of a NMR probe coil circuit according to the present invention.

FIG. 1 shows a probe coil circuit which may be used with the method of the present invention to achieve the desired Q switching. An RF signal $X_{RF}$ is input to probe coil 10, and has the same frequency as that desired for the excitation of the appropriate nuclei. capacitors 12, 14, 16 are used for tuning and matching of the coil 10. The Q of the circuit is dependent on these values, and also on the effective resistance value of PIN diode 18. An input signal $Y_Q$ is used to control the effective component value of PIN diode 18. When $Y_Q$ is "high" (i.e. is a relatively high DC voltage level), PIN diode 18 is turned "on", and appears to RF input signal $X_{RF}$ as a small resistance value. When the $Y_Q$ is "low" (i.e. is a relatively low voltage level, typically a large negative voltage), PIN diode 18 has a small capacitance value.

Because the effect of PIN diode 18 changes from resistance to capacitance as the input $Y_Q$ changes from on to off, the Q of the circuit, as faced by input RF signal $X_{RF}$, also changes. A high frequency choke 20 is provided to allow isolation of the $Y_Q$ input from $X_{RF}$, while allowing the relatively slow-changing DC pulses of $Y_Q$ to pass substantially unimpeded. The component values of coil 10 and capacitors 12, 14 and 16 are selected so as to maximize the Q of the circuit for $X_{RF}$ when $Y_Q$ is off. When $Y_Q$ is then turned on, the circuit is "detuned," and the Q value drops appreciably. Thus, switching $Y_Q$ on and off corresponds to alternating between the "low" cycles and the "high" cycles discussed above.

Alternating the probe coil circuit between a high-Q state and a low-Q state results in an overall reduction in radiation damping. The overall (i.e. time-averaged) Q of the circuit is determined by the ratio of the high cycles to the low cycles. As such, the time-based switching of the probe circuit Q may be represented by an alternating signal, the duty cycle of which determines the radiation damping of the probe. Such a signal representation is depicted in FIG. 2, in which the switching of the circuit Q is shown relative to time.

Figure 2:
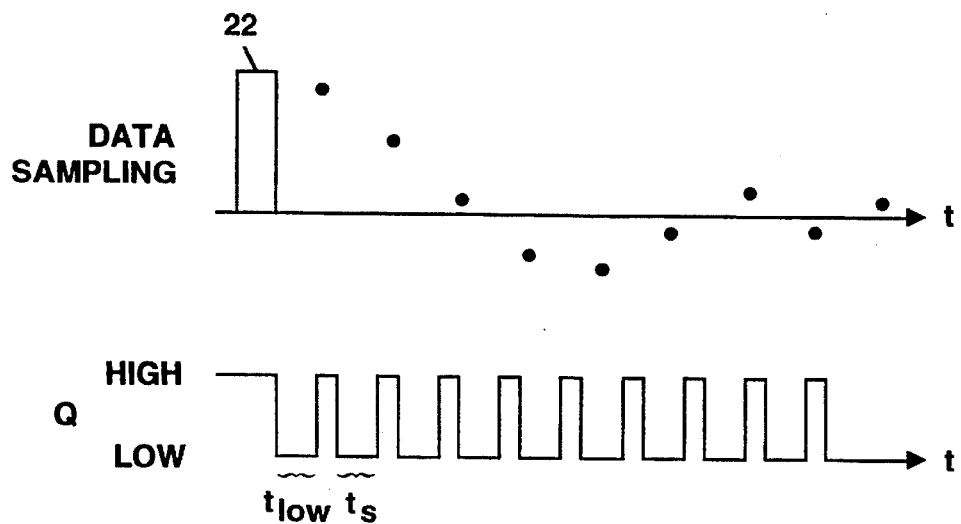
FIG. 2 is a schematic time line depiction of the change in probe circuit Q of the present invention with the periodic data sampling of the probe.

Shown adjacent to the plot of $Y_Q$ in FIG. 2 is a plot of the periodic data sampling of the experiment with time. After an initial excitation pulse 22, the time of each data sample taken of the decaying resonance signal is shown by a dot on the "data sampling" time line. The two time lines are aligned so as to demonstrate the synchronization between the Q of the probe coil circuit and the time of sampling. As shown, the Q factor of the probe coil circuit is brought high (i.e. by bringing $Y_Q$ low) prior to the taking of a data sample of the resonance signal. The Q factor is then brought low again (by switching $Y_Q$ high) until the next sample point is to be taken.

Because of the switching between a high-Q and low-Q mode, it is possible to define an effective, time-averaged Q value of the resonant circuit, which is a function of the "off ratio" of the Q-switching (i.e. the ratio of duration of an low cycle ($t_{low}$) to the total sampling interval time of an low cycle and a high cycle ($t_s$)). This time-averaged Q value assumes that the low Q value equals zero, and may be defined by the equation:

$$Q_{eff} = (1 - t_{low}/t_s) Q_{high}$$

where $Q_{eff}$ is the effective quality factor during acquisition, $Q_{high}$ is the quality factor of the probe during the high cycles, $t_{low}$ is the duration of each low cycle and, t is the total sampling interval (i.e. $t_{low} + t_{high}$). The lowering of the effective Q during data acquisition reduces the rate of change $T_d^{-1}$ for radiation damping because the effective value of Q is reduced. As a result, the detected resonance line is narrowed.

Since the effective Q is determined by the timing of the Q-switching, in the preferred embodiment this timing is controlled by a controller 24 (preferably a data processor). The controller 24 is shown schematically in FIG. 1. The controller 24 may be a computer that controls other aspects of the NMR equipment as well. By using controller 24, a reproducible and continuous effective Q value is ensured.

Figure 3:
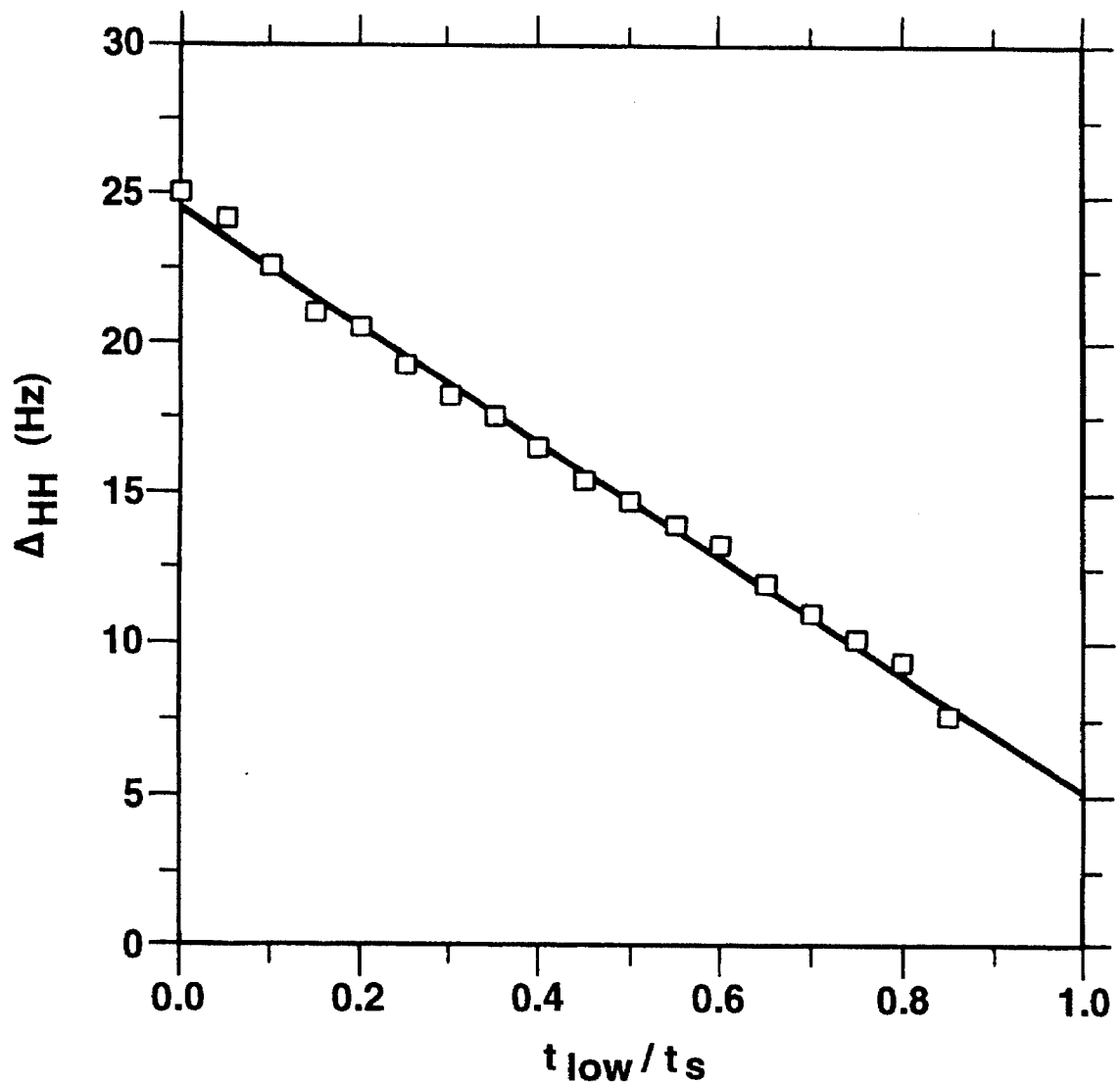
FIG. 3 is a graphical depiction of the variation in spectral line width of a resonance signal detected according to the present invention as the duty cycle of the Q switching is changed.

Depicted in FIG. 3 is a graph of the line width at half height (ΔHH–in Hertz) from a water resonance signal as a function of the off ratio $t_{low}/t_s$ and therefore as a function of the effective Q. The variation in line width demonstrates a varying degree of radiation damping controlled by adjusting the time $t_{low}$. As shown, as $t_{low}$ is increased, the line width is reduced, improving the resolution of the detected signal. In the preferred embodiment, a maximum off ratio of 0.85 is used. This maximum is used in order to allow sufficient time for accurate data sampling. Using this maximum off ratio, half-height line width is reduced by a factor of three over prior art methods. As shown in FIG. 3, the relationship between the line width and the off ratio is linear. This is a result of the corresponding linear relationship between the off ratio and the rate of change $T_d^{-1}$ of the magnetization vector.

Figure 4A:
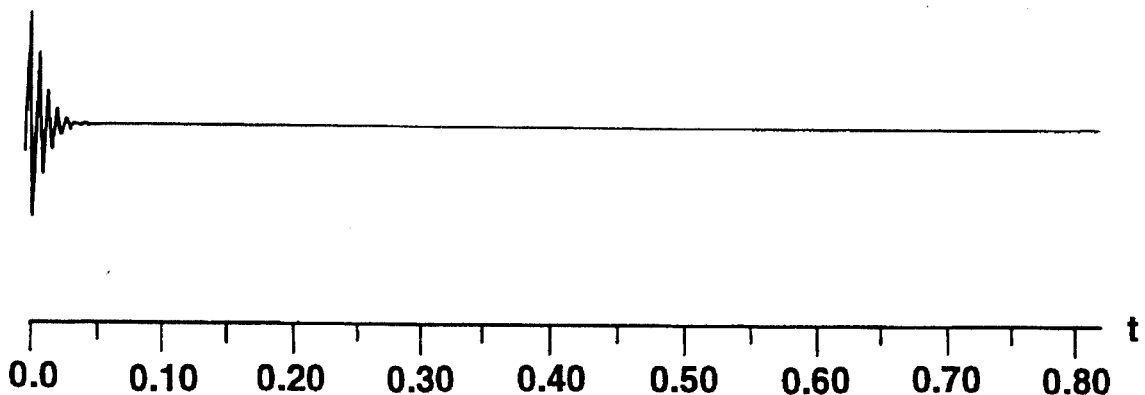
FIG. 4A is a time-based plot of a resonance signal taken with a prior art NMR probe.
Figure 4B:
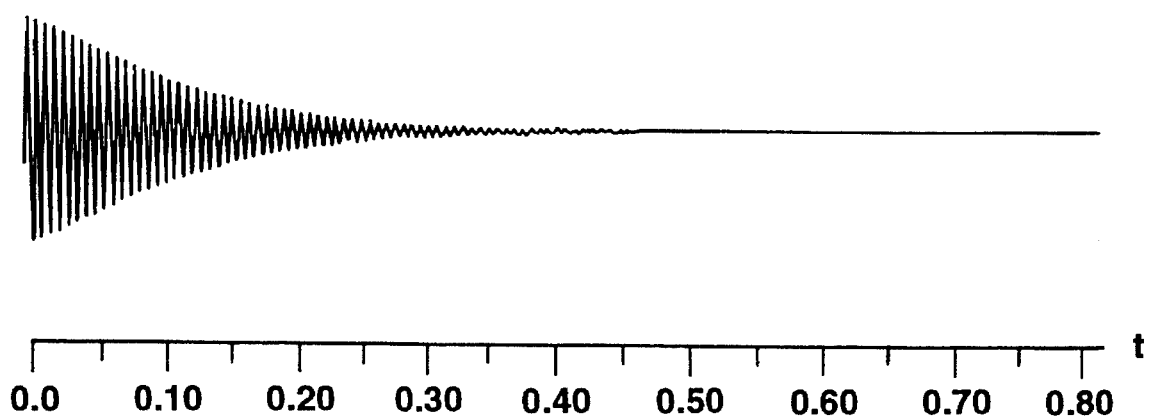
FIG. 4B is a time-based plot of a resonance signal taken a probe having Q switching in accordance with the present invention.

FIGS. 4A and 4B demonstrate the improvement in free induction decay using the present invention. FIG. 4A is a plot of a resonance signal of a proton NMR of water taken with a prior art NMR probe after excitation with a 90° pulse. As shown, the signal demonstrates a fast decay due to radiation damping. FIG. 4B is a sample of the proton free induction decay of the resonance of a water sample using a probe that applies the Q-switching method of the present invention. As with the resonant signal of FIG. 4A, this sample was obtained after a 90° pulse. However, the FIG. 4B probe was subjected to automatic Q-switching during data acquisition. A comparison of this decay with that of FIG. 4A demonstrates the extent to which the present invention reduces the effect of radiation damping and extends free induction decay.

The frequency bandwidth of a high resolution, high-Q NMR probe is always much broader than the observed spectral width. Therefore, switching the probe from a low-Q to a high-Q mode during data observation does not itself degrade the signal-to-noise ratio of the probe signal. Since the probe does not itself restrict the observation bandwidth, the receiver includes filters (either analog or digital) to prevent noise from being aliased into the detected bandwidth. While it is preferable that these filters be narrow band, a narrow band results in long switching transients. Thus, while the rapid switching of the resonant circuit Q does not reduce the signal level, it may necessitate broadening the filter width which, in turn, permits some additional noise to be aliased into the spectral region.

The process of switching from a low Q to a high Q, taking a data point, and switching back to a low Q can take place in a time as short as 2µs, a time frame which imposes no practical limitation on the observation bandwidth. However, because of the additional noise which may be introduced if the Q switching time is made this fast, using a longer Q switching time may be advantageous. By making the low value of Q for the probe circuit extremely low, an effective suppression of radiation damping can be achieved by using a high cycle to low cycle ratio as low as 1 to 5. In general, it is possible to enlarge the spectral width significantly, and thus decrease the noise level in the region of interest (reducing the amount of aliasing), while maintaining a high off ratio for Q-switching.

Typical applications of Q-switching during data acquisition include experiments in which strong resonances, such as solvent signals, are not suppressed. In experiments involving a high degree of solvent suppression, the broadening due to radiation damping is not usually present, unless reintroduced by relaxation of the solvent resonances during the experiment. The present invention is particularly useful in studies of exchangeable protons as well as in experiments that involve strong magnetization components antiparallel to the main magnetic field, such as in inversion recovery relaxation measurements and during some combinations of RF phases in phase cycled experiments. Especially in experiments involving variable time delays, a combination of Q switching during these delays and during acquisition results in a line width, of the otherwise broadened resonance, which is independent of the delay time.

While the invention has been shown and described with reference to a preferred embodiment thereof, it will be understood that various changes in form and detail may be made therein without departing from the spirit and scope of the invention as defined by the appended claims.

What is claimed is:

1. A method of reducing the effect of radiation damping on free induction decay during an NMR measurement of a sample, the method comprising:

providing an NMR probe having a coil circuit for which the quality factor changes between a high-Q state and a low-Q state in response to the application of a Q signal;

exciting nuclei of interest in the sample;

detecting a resonance signal of the nuclei of interest at selected sampling times during free induction decay following the excitation pulse; and applying the Q signal to the probe coil circuit such as to change the coil circuit to a high-Q state during the sampling times and change the coil circuit to a low-Q state in between the sampling times.

2. A method according to claim 1 further comprising limiting characteristics of the sample such that a radiation damping time constant is shorter than the spin-spin relaxation time of the sample.

3. A method according to claim 1 wherein exciting the nuclei of interest comprises exciting the nuclei of interest with an excitation pulse.

4. A method according to claim 3 wherein the excitation pulse is one of a train of excitation pulses which are used to excite the nuclei of interest.

5. A method according to claim 1 wherein detecting a resonance signal further comprises detecting resonance signals in multiple dimensions during a detection period of a multi-dimensional NMR experiment.

6. A method according to claim 1 wherein applying the Q signal to the probe coil circuit comprises applying the Q signal to the probe coil circuit automatically with a controller.

7. A method according to claim 6 wherein applying the Q signal to the probe coil circuit further comprises applying the Q signal to the probe coil circuit with a controller that comprises a data processor and which controls additional NMR components used in performing the measurement.

8. A method according to claim 1 wherein detecting a resonance signal of the nuclei of interest at selected times further comprises detecting the resonance signal periodically.

9. A method according to claim 1 further comprising adjusting the Q signal such that the low-Q state and the high-Q state of the probe coil circuit are balanced to provide a substantial reduction in radiation damping without an inordinate increase in detected signal noise.

10. A method of reducing the effect of radiation damping on free induction decay during an NMR measurement of the resonance signals of nuclei of interest contained in a sample for which a radiation damping time constant is shorter than the spin-spin relaxation time of the sample, the method comprising:

providing an NMR probe having a coil circuit for which the quality factor changes between a high-Q state and a low-Q state in response to the application of a Q signal;

exciting the nuclei of interest in the sample with an excitation pulse;

periodically detecting a resonance signal of the nuclei of interest at predetermined times during free induction decay following the excitation pulse; and applying the Q signal to the probe coil circuit with a controller such as to automatically change the coil circuit to a high-Q state during the sampling times and change the coil circuit to a low-Q state in between the sampling times.

\* \* \* \* \*